us009436082B2

(12) United States Patent
Wang et al.

(10) Patent No.: US 9,436,082 B2
(45) Date of Patent: Sep. 6, 2016

(54) COMPOSITIONS COMPRISING BASE-REACTIVE COMPONENT AND PROCESSES FOR PHOTOLITHOGRAPHY

(75) Inventors: Deyan Wang, Hudson, MA (US); Shintaro Yamada, Shrewsbury, MA (US); Cong Liu, Shrewsbury, MA (US); Mingqi Li, Shrewsbury, MA (US); Joon-Seok Oh, Natick, MA (US); Chunyi Wu, Shrewsbury, MA (US); Doris Kang, Shrewsbury, MA (US); Cheng-Bai Xu, Southboro, MA (US)

(73) Assignee: Rohm and Haas Electronics Materials LLC, Marlborough, MA (US)

(*) Notice: Subject to any disclaimer, the term of this patent is extended or adjusted under 35 U.S.C. 154(b) by 0 days.

(21) Appl. No.: 13/341,067

(22) Filed: Dec. 30, 2011

(65) Prior Publication Data

US 2012/0171626 A1   Jul. 5, 2012

Related U.S. Application Data

(60) Provisional application No. 61/428,696, filed on Dec. 30, 2010.

(51) Int. Cl.
| | | |
|---|---|---|
| *G03F 7/004* | (2006.01) | |
| *G03F 7/30* | (2006.01) | |
| *G03F 7/039* | (2006.01) | |
| *G03F 7/11* | (2006.01) | |

(52) U.S. Cl.
CPC ............ *G03F 7/0046* (2013.01); *G03F 7/0397* (2013.01); *G03F 7/11* (2013.01); *G03F 7/30* (2013.01)

(58) Field of Classification Search
CPC ...... G03F 7/0046; G03F 7/0397; G03F 7/11; G03F 7/30

USPC ...................... 430/322, 325, 270.1
See application file for complete search history.

(56) References Cited

U.S. PATENT DOCUMENTS

| | | | |
|---|---|---|---|
| 2006/0246373 A1* | 11/2006 | Wang ...................... | 430/270.1 |
| 2006/0292484 A1* | 12/2006 | Ito et al. .................. | 430/270.1 |
| 2009/0317743 A1* | 12/2009 | Shiono et al. ............ | 430/270.1 |

FOREIGN PATENT DOCUMENTS

| | | |
|---|---|---|
| CN | 1054838 A | 9/1991 |
| CN | 1479173 A | 3/2004 |
| CN | 1881085 A | 12/2006 |
| CN | 101040220 A | 9/2007 |
| JP | 2010134012 A | 6/2010 |
| JP | 2011231132 A | 11/2011 |
| JP | 2012128067 A | 7/2012 |

OTHER PUBLICATIONS

English Language Summary of Office Action issued in counterpart Japanese Patent Application No. 2012-000221, Dispatch Date: Oct. 8, 2015 (4 Pages).
English Language Summary of Office Action issued in counterpart Chinese Patent Application No. 201110463316.0 (9 Pages).
English Language Summary of Third Office Action issued in counterpart Chinese Patent Application No. 201110463316.0 (2 Pages).
English Language Summary of Office Action and Examination Report issued in counterpart Taiwan Patent Application No. 102-2(6)01205-10221523300, Date: Nov. 7, 2013 (4 Pages).

* cited by examiner

*Primary Examiner* — Brittany Raymond
(74) *Attorney, Agent, or Firm* — Mintz Levin Cohn Ferris Glovsky and Popeo, P.C.; Peter F. Corless

(57) ABSTRACT

New photoresist compositions are provided that comprise one or more materials that have base-reactive groups and are particularly useful for dry lithography. Particularly preferred photoresists of the invention can exhibit reduced defects following development of a coating layer of the resist.

9 Claims, No Drawings

COMPOSITIONS COMPRISING BASE-REACTIVE COMPONENT AND PROCESSES FOR PHOTOLITHOGRAPHY

This application claims the benefit of priority under 35 U.S.C. §119(e) to U.S. Provisional Application No. 61/428,696, filed Dec. 30, 2010, the entire contents of which application are incorporated herein by reference.

The present invention relates to new photoresist compositions that comprise one or more materials that have base-reactive groups, i.e. functional groups that can undergo cleavage reactions in the presence of aqueous alkaline photoresist development during a resist development step. Photoresists of the invention are used in dry exposure applications.

Photoresists are photosensitive films used for transfer of an image to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Current exposure methods include 1) dry exposure: i.e. where air or other non-liquid medium is interposed between the exposure tool lens and the photoresist top surface, and 2) immersion exposure: i.e. where water of other liquid is interposed between an exposure tool lens and the photoresist top surface (and contacts the photoresist top surface or contacts a coating layer that has been overcoated the photoresist layer).

Following exposure, the photoresist is developed to provide a relief image that permits selective processing of a substrate.

While currently available photoresists are suitable for many applications, current resists also can exhibit significant shortcomings, particularly in high performance applications.

For instance, many photoresists will give rise to post-development defects known as "Blob Defects" where fragments of the photoresist material remain in substrate areas that are desired to be cleared upon development (i.e. in the case of a positive resist, exposed resist regions). Such photoresist fragments can interfere with subsequent lithographic processing e.g. etching, ion implantation, and the like. See, for instance, U.S. Pat. No. 6,420,101. See also U.S. provisional application No. 61/413,835.

It thus would be desirable to have new photoresists, including photoresists that exhibit reduced defects such as Blob Defects.

We now provide new photoresist compositions and processes. Photoresist compositions comprise a material that comprises one or more base-reactive groups and are used in dry exposure applications, i.e. where air or other non-liquid medium is interposed between an exposure tool and a photoresist top surface.

More particularly, preferred photoresists of the invention may comprise:
  (i) one or more resins,
  (ii) a photoactive component which may suitably comprise one or more photoacid generator compounds, and
  (iii) one or more materials that comprise one or more base-reactive groups, where the base-reactive groups are reactive after exposure and post-exposure lithographic processing steps. Preferably, the base-reactive group(s) will react upon treatment with aqueous alkaline developer compositions, such as 0.26N tetramethylammonium hydroxide aqueous developer compositions. Preferably, such materials that comprise base-reactive group(s) are substantially non-mixable with the one or more resins. Preferred base-reactive materials are resin that comprise one or more base-reactive groups such as fluorinated esters.

As referred to herein, a base-reactive group will not react significantly (e.g. will not undergo a bond-breaking reaction) prior to a development step of the photoresist that comprises the base-reactive group. Thus, for instance, a base-reactive group will be substantially inert during pre-exposure soft-bake, exposure and post-exposure bake steps. A base-reactive group as referred to herein will typically be reactive under typical photoresist development condition, e.g. single puddle development with 0.26N tetrabutyl ammonium hydroxide developer composition. Another typical photoresist development condition where a base-reactive group as referred to herein will typically be reactive is a dynamic development such as where 0.26N tetrabutyl ammonium hydroxide developer composition is dispensed (e.g. through a gp nozzle) onto the imaged photoresist layer for a suitable time such as 10 to 30 seconds.

In one aspect, preferred base reactive materials will comprise repeat units where one or more repeat each comprise multiple base-reactive groups, e.g. 2 or 3 base-reactive groups such as fluorinated esters that may be the same or different moieties in each such repeat unit. In certain aspects, a preferred base reactive material is a resin that comprises one or more repeat units where at least one repeat unit comprises multiple base reactive moieties (e.g. one or more fluorinated esters), such as 2 or 3 base reactive groups e.g. multiple fluorinated esters (where each such ester may be the same or different) in a single resin repeat unit. Such resin repeat units may be provided e.g. by polymerization of a monomer that comprises multiple base reactive moieties. In certain aspects, acrylic ester monomers (which includes e.g. both acrylate and methacrylate monomers) that comprise multiple base reactive groups (such as fluorinated esters) are preferred reagents to polymerize either to form a homopolymer or to polymerize with one or more other distinct monomers which may or may not have base reactive moieties to form a copolymer, terpolymer, tetrapolymer, pentapolymer or other higher order base reactive resin. As an alternative route to such resins with repeat units having multiple base reactive moieties, multiple base reactive groups may be grafted onto a reactive repeat unit of a pre-formed resin.

Base reactive materials may comprise other groups in addition to multiple base reactive moieties, e.g. an acid (e.g. carboxy (—COOH); sulfonic acid (—SO3H), hydroxy (—OH), a halogen particularly F, Br, Cl or I and in some aspects halo other than fluoro i.e. Br, Cl or I; cyano; nitro; sulfono; sulfoxide; esters and acetal groups including photoacid-labile ester and acetal groups; and the like.

In such preferred base reactive materials (e.g. resins) that comprise repeat units where one or more repeat each comprise multiple base-reactive groups, treatment with base such as an aqueous alkaline photoresist development composition can produce multiple (e.g. 2 or 3) polar moieties in a single repeat unit as a result of the reaction of the multiple base reactive groups with base (such as an aqueous alkaline photoresist development composition). These base-reaction-product polar groups suitably may be the same or different within a single repeat unit and may be e.g. hydroxyl, carboxylic acid, sulfonic acid and the like.

In a further preferred aspect of the invention, preferred base reactive materials may comprise (i) one or more base reactive groups and (ii) one or more acid-labile groups such as one or more photoacid-labile ester moieties (e.g. t-butyl ester) or photoacid-labile acetal groups. In the case where the base-reactive material is a polymer, suitably a base reactive moiety and the photoacid-labile groups may be present on the same polymer repeat unit (e.g. both groups may be present on a single monomer that is polymerized to form the base reactive resin), or the base reactive moiety and the photoacid-labile may be present on distinct polymer repeat units (e.g. the distinct groups may be present on distinct monomers that are polymerized to form the resin).

Particularly preferred photoresists of the invention can exhibit reduced defects associated with a resist relief image formed from the photoresist composition.

While not being bound by any theory, it is believed that photoresists of the invention can exhibit reduced defects by providing a more hydrophilic surface of the photoresist relief image as a result of reaction of the base-reactive groups and production of more polar (hydrophilic) groups during the development step. By providing a more hydrophilic surface, water bead formation on and around the resist relief image will be diminished during development and subsequent deionized rinse steps. Reduced water bead formation in turn can result in reduced occurrence of defects, including Blob Defects where resist fragments may be collected within water beads and deposited in undesired locations such as substrate areas bared upon development.

In this regard, particularly preferred photoresists of the invention after development will exhibit (coating layers of the resist) water contact receding angles of less than about 40°, more preferably less than 30°, still more preferably less than 25° or 20°. As referred to herein, water contact angles, including static contact angles, receding angles and advancing angles, are as defined and can be determined by procedures as disclosed in Burnett et al., *J. Vac. Sci. Techn. B*, 23(6), pages 2721-2727 (November/December 2005).

As referred to herein, one or more materials that are substantially non-mixable with the one or more photoresist resins can be any material added to a photoresist that results in reduced defects upon aqueous alkaline development.

Suitable substantially non-mixable materials for use in photoresists of the invention include compositions that comprise silicon and/or fluorine substitution in addition to comprising one or more base-reactive groups.

Also preferred are those substantially non-mixable materials that contain photoacid-labile groups, such as photoacid-labile ester or acetal groups, including such groups as described herein employed in a resin component of a chemically amplified photoresist.

Preferred substantially non-mixable materials for use in photoresists of the invention also will be soluble in the same organic solvent(s) used to formulate the photoresist composition.

Particularly preferred substantially non-mixable materials for use in photoresists of the invention also will have lower surface energy and/or smaller hydrodynamic volume than the one or more resins of the photoresist's resin component. The lower surface energy can facilitate segregation or migration of the substantially non-mixable materials to top or upper portions of an applied photoresist coating layer. Additionally, relative smaller higher hydrodynamic volume also can be preferred because it can facilitate efficient migration (higher diffusion coefficient) of the one or more substantially non-mixable materials to upper regions of the applied photoresist coating layer.

Preferred substantially non-mixable materials for use in photoresists of the invention also will be soluble in photoresist developer compositions (e.g. 0.26N aqueous alkaline solution). Thus, in addition to photoacid-labile groups as discussed above, other aqueous base-solubilizing groups may be included in the substantially non-mixable materials such as hydroxyl, fluoroalcohol (e.g. —$C(OH)(CF_3)_2$), carboxy and the like.

Suitable substantially non-mixable materials for use in photoresists of the invention also may be in the form of particles. Such particles may include polymers that are polymerized in the form discrete particles, i.e. as separate and distinct polymer particles. Such polymer particles typically have one or more different characteristics from linear or ladder polymers such as linear or ladder silicon polymers. For example, such polymer particles may have a defined size and a low molecular weight distribution. More particularly, in a preferred aspect, a plurality of the polymer particles may be employed in a photoresist of the invention with a mean particle size (dimension) of from about 5 to 3000 angstroms, more preferably from about 5 to 2000 angstroms, still more preferably from about 5 to about 1000 angstroms, yet more preferably from about 10 to about 500 angstroms, even more preferably from 10 to 50 or 200 angstroms. For many applications, particularly preferred particles have a mean particle size of less than about 200 or 100 angstroms.

Additional suitable substantially non-mixable materials for use in photoresists of the invention may have Si content, including silsesquioxane materials, materials with $SiO_2$ groups, and the like. Preferred silicon-containing substantially non-mixable materials also include polyhedral oligomeric silsesquioxanxes.

Preferred imaging wavelengths of lithographic systems of the invention include sub-300 nm wavelengths e.g. 248 nm, and sub-200 nm wavelengths e.g. 193 nm, as well as EUV (13 nm) and e-beam. Photoresists of the invention also can be formulated for higher wavelength imaging applications including i-line (365 nm) and g-line (436 nm).

In addition to one or more substantially non-mixable materials, particularly preferred photoresists of the invention may contain a photoactive component (e.g. one or more photoacid generator compounds) and one or more resins that are chosen from among:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, incorporated herein by reference, as well as blends of i) and/or ii) and/or iii);

2) phenolic resins that do not contain acid-labile groups such as poly(vinylphenol) and novolak resins that may be employed in I-line and G-line photoresists together with a diazonaphthoquinone photoactive compound and have been described e.g. in U.S. Pat. Nos. 4,983,492; 5,130,410; 5,216,111; and 5,529,880;

3) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664, incorporated herein by reference; ii) polymers that contain alkyl acrylate units such as t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, all incorporated herein by reference, and iii) polymers that contain polymerized anhydride units, particularly polymerized maleic anhydride and/or itaconic anhydride units, such as disclosed in European Published Application EP01008913A1 and U.S. Pat. No. 6,048,662, both incorporated herein by reference, as well as blends of i) and/or ii) and/or iii);

4) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914 and U.S. application Ser. No. 09/567,634.

5) resins that contain Si-substitution including poly(silsequioxanes) and the like and may be used with an undercoated layer. Such resins are disclosed e.g. in U.S. Pat. No. 6,803,171.

6) a resin that contains fluorine substitution (fluoropolymer), e.g. as may be provided by polymerization of tetrafluoroethylene, a fluorinated aromatic group such as fluorostyrene compound, compounds that comprise a hexafluoroalcohol moiety, and the like. Examples of such resins are disclosed e.g. in PCT/US99/21912.

Preferred photoresists of the invention include both chemically-amplified positive-acting and negative-acting photoresists. Typically preferred chemically-amplified positive resists include one or more resins that comprise photoacid-labile groups such as photoacid-labile ester or acetal groups.

The invention further provides methods for forming a photoresist relief image and producing an electronic device using photoresists of the invention. The invention also provides novel articles of manufacture comprising substrates coated with a photoresist composition of the invention.

Other aspects of the invention are disclosed infra.

As discussed above, in preferred aspects, the base-reactive material component of a resist of the invention suitably will have the lowest surface energy relative to any photoresist components in the resist formulation, including solvent(s). The surface energy (surface tension) of the solvents is measured in a time frame of 100 ms or shorter.

Preferred base-reactive materials are able to switch to a more hydrophilic state during aqueous alkaline development and maintain such enhanced hydrophilicity throughout the rinsing step. In certain aspects, the hydrophilicity can be measured by the water receding angle. In preferred aspects, the "reacted" (post-development) base-reactive material will exhibit receding angle of less than 30°, more preferably a receding angle of less than 25°.

As discussed above, particularly preferred photoresists of the invention can exhibit reduced defects following aqueous alkaline development.

As discussed, particularly preferred photoresists of the invention after development will have exhibit (coating layers of the resist) water contact receding angles of less than about 40°, more preferably less than 30°, still more preferably less than 25° or 20°. In certain aspects of the invention, prior to development (including after exposure) a photoresist composition coating layer of the invention may exhibit a water contact receding angle of in excess of 30°, such as 40° or great, 50° or greater, or even 60° or greater.

In preferred photoresists of the invention, upon treatment with aqueous alkaline developer composition (e.g. 0.26N tetramethylammonium hydroxide single puddle mode), the water contact receding angle of the photoresist composition coating layer will decrease by at least 10, 15, 20, 30, 50, 60, 70 or 80 percent.

For photoresist compositions of the invention, preferred materials that comprise one or more base-reactive groups are resins that comprise one or more repeat units that comprise base-reactive group(s). Such resins may contain a wide range of base-reactive groups, e.g. from about 1 to 90 or 100 percent of the total number of repeat units of a resin may comprise base-reactive groups, more typically from about 1 to up to about 20, 30, 40, 50 or 60 percent of the total number of repeat units of a resin may comprise base-reactive groups.

Preferred base-reactive groups of a component of resists of the invention may provide upon treatment with base (such as aqueous alkaline developer) one or more hydroxy groups, one or more carboxylic acid groups, one or more sulfonic acid groups, and/or one or more other polar groups that will render the resist coating layer more hydrophilic.

More particularly, preferred base-reactive groups and monomers that comprise such groups include the following. As should be understood, such monomer can be polymerized to provide a resin that comprises base-soluble groups.

Single Hydroxy Group

Preferred base-reactive groups include those moieties that may provide a single hydroxyl group upon treatment with base (such as aqueous alkaline developer composition). More specifically, suitable monomers that comprise such base-reactive groups include those of the following Formula (I):

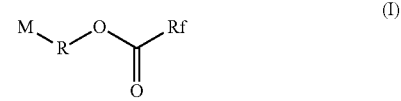

where M is a polymerizable functional group including vinyl and acrylic, R is an alkyl spacer group (e.g. $C_{1-20}$ linear, branched or cyclic) with or without carboxyl linkages, Rf is a fluoro or perfluoro alkyl groups (e.g. $C_{1-20}$ alkyl with 1 to 8 fluoro atoms) with at least the alfa carbon (the carbon next to the carbonyl carbon) being fluorinated.

Exemplary monomers of the above Formula (I) include the following Monomers 1 through 18. In the below structures, the monomer with base-reactive group is depicted on the left and the monomer after reaction with base to provide a hydroxyl group is depicted in the right.

Monomer-1
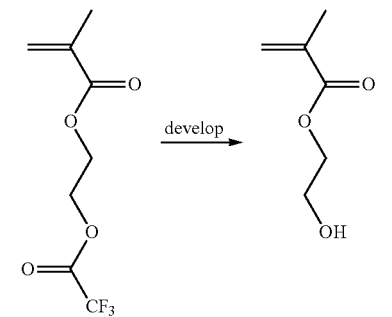

Monomer-2
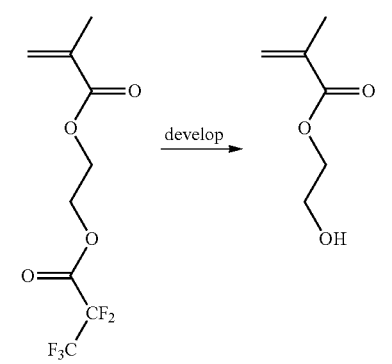

Monomer-3
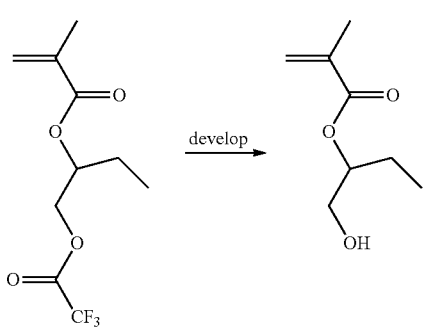

Monomer-4
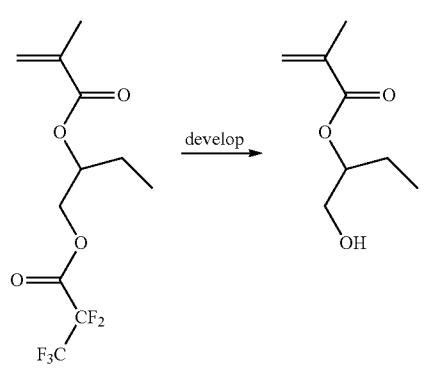

Monomer-5
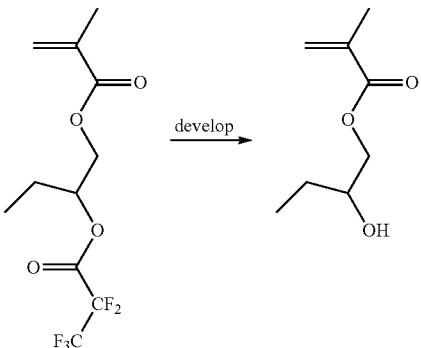

Monomer-6
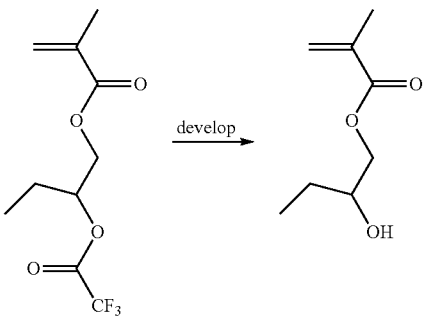

Monomer-7
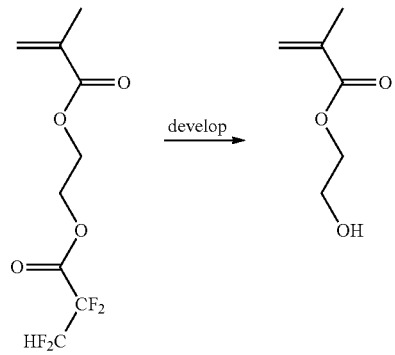

Monomer-8
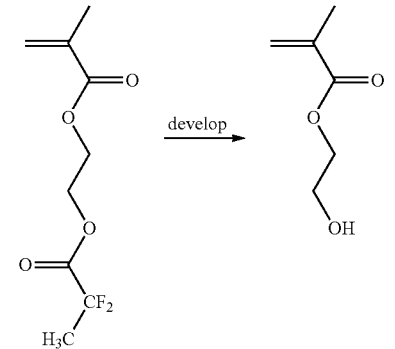

Monomer-9
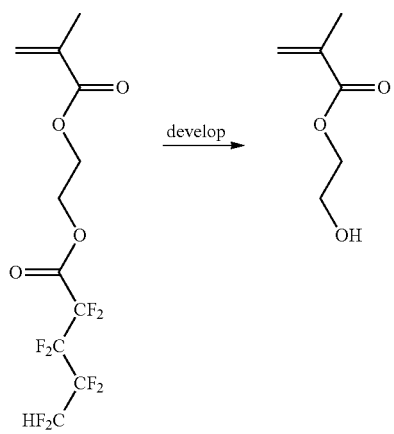
Monomer-13
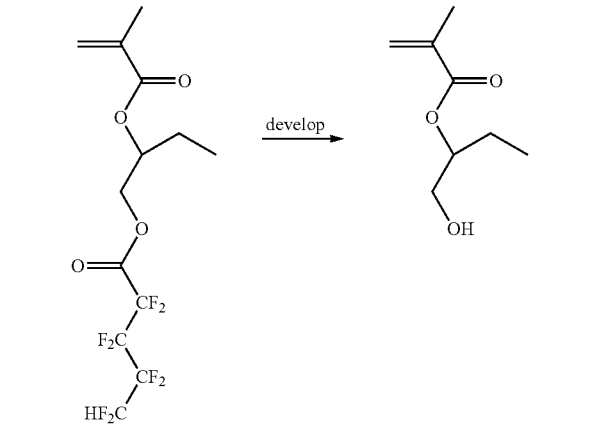
Monomer-10
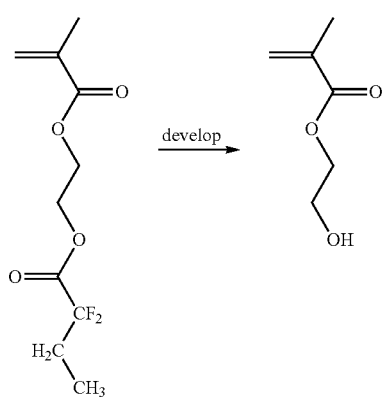
Monomer-14
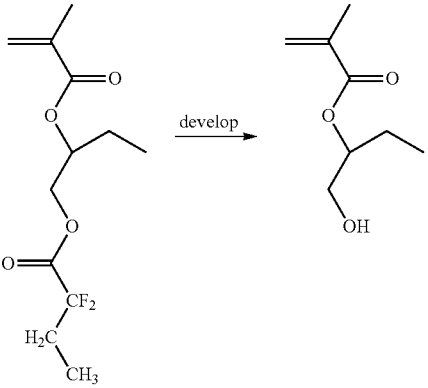
Monomer-11
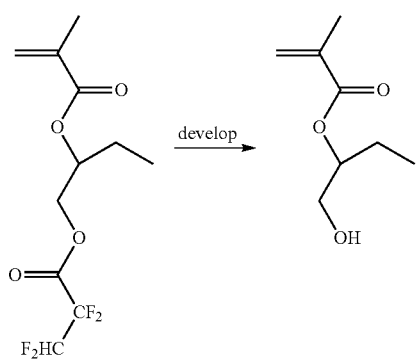
Monomer-15
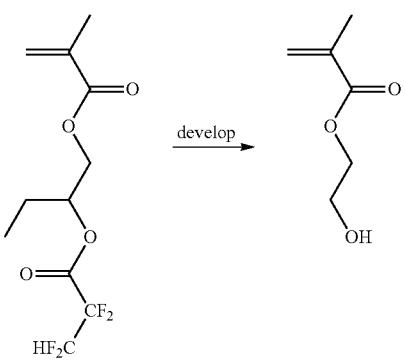
Monomer-12
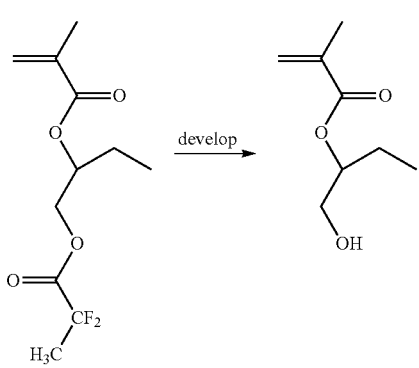
Monomer-16
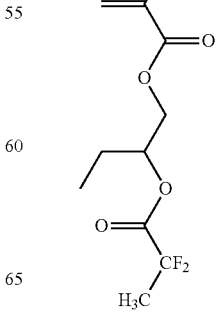

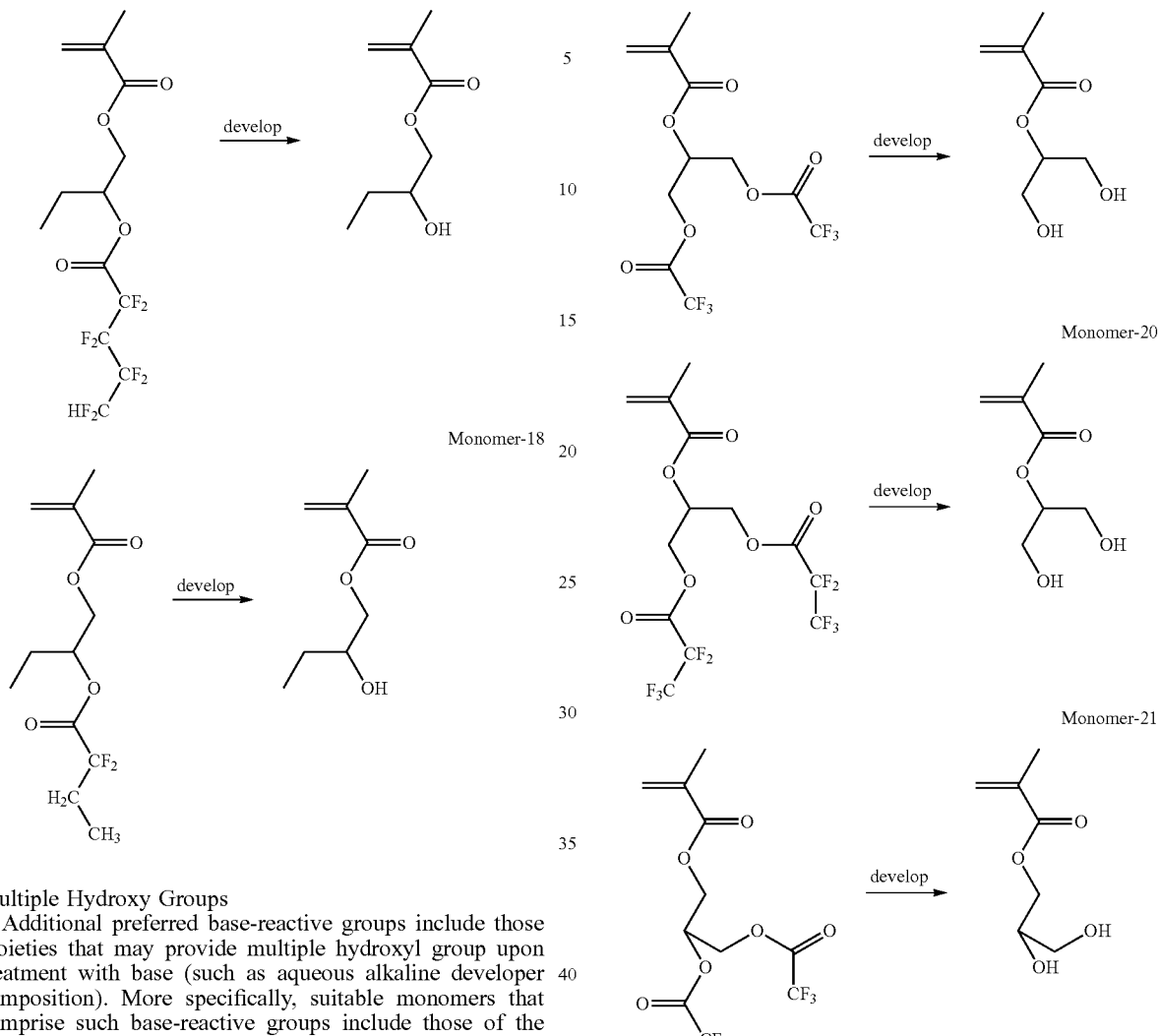

Multiple Hydroxy Groups

Additional preferred base-reactive groups include those moieties that may provide multiple hydroxyl group upon treatment with base (such as aqueous alkaline developer composition). More specifically, suitable monomers that comprise such base-reactive groups include those of the following Formula (II):

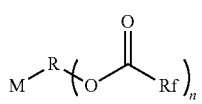

where M is a polymerizable functional group including vinyl and acrylic, R is an alkyl spacer group (e.g. $C_{1-20}$ linear, branched or cyclic) with or without carboxyl linkages, Rf is a fluoro or perfluoro alkyl groups (e.g. $C_{1-20}$ alkyl with 1 to 8 fluoro atoms) with at least the alfa carbon (the carbon next to the carbonyl carbon) being fluorinated, and n being an integer equal to or greater than 2.

Exemplary monomers of the above Formula (II) include the following Monomers 19 through 21. These monomers also exemplify where a single repeat unit of a base reactive material (e.g. a repeat unit of a base reactive resin) comprises multiple base reactive moieties, e.g. 2, 3, 4 or 5 base reactive moieties, more typically 2 or 3 base reactive moieties. In the below structures, the monomer with base-reactive group is depicted on the left and the monomer after reaction with base to provide a hydroxyl group is depicted on the right.

Switching to Carboxylic Acid Group

Additional preferred base-reactive groups include those moieties that may provide one or more carboxylic acid groups upon treatment with base (such as aqueous alkaline developer composition). More specifically, suitable monomers that comprise such base-reactive groups include those of the following Formula (III):

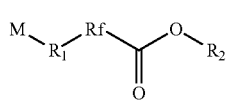

where M is a polymerizable functional group including vinyl and acrylic, R1 is an alkyl spacer group (e.g. $C_{1-20}$ linear, branched or cyclic) with or without carboxyl linkages, Rf is a fluoro or perfluoro alkylene groups (e.g. $C_{1-20}$ alkyl with 1 to 8 fluoro atoms) with at least the alfa carbon (the carbon next to the carbonyl carbon) being fluorinated, and R2 is an alkyl group (e.g. $C_{1-20}$ linear, branched or cyclic).

Exemplary monomers of the above Formula (III) include the following Monomers 10 and 11. In the below structures, the monomer with base-reactive group is depicted on the left and the monomer after reaction with base to provide a hydroxyl group is depicted in the right.

Monomer-22

Monomer-23

Multiple Base Reactive Moieties

Additional preferred base-reactive groups include those moieties wherein a single repeat unit of a base reactive material (e.g. a repeat unit of a base reactive resin) comprises multiple base reactive moieties, e.g. 2, 3, 4 or 5 base reactive moieties, more typically 2 or 3 base reactive moieties. Exemplary preferred monomers of this type include the following structures. In the below structures, the monomer with base-reactive group is depicted on the left and the monomer after reaction with base to provide a hydroxyl group is depicted in the right. The below monomers also exemplify monomers that provide multiple polar (particularly, hydroxy) groups upon development.

Monomer 24

Monomer 25

Monomer 26

Monomer 27

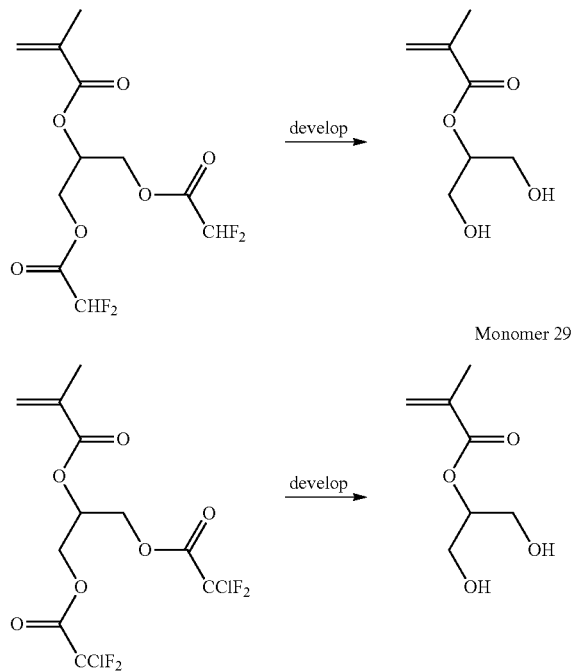

Monomer 28

Monomer 29

As discussed above, suitable materials of photoresists of the invention that are substantially non-mixable with the resist resin component can be readily identified by simple testing. In particular, as referred to herein, preferred substantially non-mixable materials will provide a decreased occurrence or amount of defects upon aqueous alkaline development relative to a comparable photoresist relative to the same photoresist system that is processed into the same manner, but in the absence of the candidate substantially non-mixable material(s). Assessment of defects (or absence thereof) can be made via scanning electron micrography. Detection of photoresist material in the immersion fluid can be conducted as described in Example 2 of U.S. Patent Publication 2006/0246373 and includes mass spectroscopy analysis of the immersion fluid before and after exposure to the photoresist. In such analysis, the immersion fluid directly contacts the tested photoresist composition layer for about 60 seconds during exposure. Preferably, addition of one or more substantially non-mixable materials provides at least a 10 percent reduction in photoresist material (again, acid or organics as detected by mass spectroscopy) residing in the immersion fluid relative to the same photoresist that does not employ such substantially non-mixable material(s), more preferably the one or more substantially non-mixable materials provides at least a 20, 50, or 100, 200, 500, or 1000 percent reduction photoresist material (again, acid and/or organics) residing in to the immersion fluid relative to the same photoresist that does not contain the substantially non-mixable material(s).

Particularly preferred substantially non-mixable materials include higher order polymers e.g. copolymers, terpolymers, tetrapolymers and pentapolymers. Particularly preferred are such polymers that comprise fluorine substitution in addition to carboxy substitution. Preferred fluoro substitution include perfluoro groups e.g. $F_3C-$, $F_3CCF_2-$, and fluorinated alcohols e.g. $(F_3C)_2C(OH)-$.

As discussed above, suitable substantially non-mixable materials include Si-containing materials. Especially preferred substantially non-mixable materials include nano-structured compositions, which are commercially available from groups such as Hybrid Plastics (Fountain Valley, Calif.), Sigma/Aldrich, and others. Such materials may include molecular silicas which have a Si—O core enveloped by organic groups; silanols; and polymers and resins which include silsesquioxane cage-structured compounds and may be silicones, styrenics, acrylics, alicyclics such as norbornenes and others.

Particles (including organic particles) useful as substantially non-mixable materials include Si-containing and fluorinated materials that have carboxy substitution. Such particles are commercially available, or can be readily synthesized, e.g. by reaction of one or more monomers together with a crosslinking agent and an initiator compound if desired. The reacted monomers may have substitution as desired e.g. fluorine, Si groups, photoacid-labile groups such as photoacid-labile esters or acetals, other base-solubilizing groups such as alcohols and the like. See Example 1 of U.S. Patent Publication 2006/0246373 for an exemplary synthesis of such particles produced with multiple distinct monomers, where one of the monomers provides a photoacid-labile group to the resulting polymer particle.

The substantially non-mixable material(s) may be present in a photoresist composition in relatively small amounts and still provide effective results. For instance, the one or more substantially non-mixable materials may be suitable present in about 0.1 to 20 weight percent based on total weight of a fluid photoresist composition. Suitable amounts also are provided in the examples which follow.

As discussed above, preferred photoresists for use in accordance with the invention include positive-acting or negative-acting chemically amplified photoresists, i.e. negative-acting resist compositions which undergo a photoacid-promoted crosslinking reaction to render exposed regions of a coating layer of the resist less developer soluble than unexposed regions, and positive-acting resist compositions which undergo a photoacid-promoted deprotection reaction of acid labile groups of one or more composition components to render exposed regions of a coating layer of the resist more soluble in an aqueous developer than unexposed regions. Ester groups that contain a tertiary non-cyclic alkyl carbon (e.g. t-butyl) or a tertiary alicyclic carbon (e.g. methyladamantyl) covalently linked to the carboxyloxygen of the ester are often preferred photoacid-labile groups of resins employed in photoresists of the invention. Acetal photoacid-labile groups also will be preferred.

Preferred photoresists of the invention typically comprise a resin component and a photoactive component. Preferably the resin has functional groups that impart alkaline aqueous developability to the resist composition. For example, preferred are resin binders that comprise polar functional groups such as hydroxyl or carboxylate. Preferably a resin component is used in a resist composition in an amount sufficient to render the resist developable with an aqueous alkaline solution.

For imaging at wavelengths greater than 200 nm, such as 248 nm, phenolic resins are typically preferred. Preferred phenolic resins are poly (vinylphenols) which may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

Also preferred for imaging at wavelengths greater than 200 nm, such as 248 nm are chemically amplified photoresists that comprise in admixture a photoactive component and a resin component that comprises a copolymer containing both phenolic and non-phenolic units. For example, one preferred group of such copolymers has acid labile groups substantially, essentially or completely only on non-phenolic units of the copolymer, particularly alkylacrylate photoacid-labile groups, i.e. a phenolic-alkyl acrylate copolymer. One especially preferred copolymer binder has repeating units x and y of the following formula:

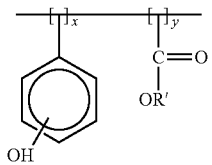

wherein the hydroxyl group may be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a $M_w$ of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornanyl or vinyl cyclohexanol compound, also may be used as a resin binder in compositions of the invention. Such copolymers also may be prepared by such free radical polymerization or other known procedures and suitably will have a $M_w$ of from about 8,000 to about 50,000, and a molecular weight distribution of about 3 or less.

Other preferred resins that have acid-labile deblocking groups for use in a positive-acting chemically-amplified photoresist of the invention have been disclosed in European Patent Application 0829766A2 of the Shipley Company (resins with acetal and ketal resins) and European Patent Application EP0783136A2 of the Shipley Company (ter-polymers and other copolymers including units of 1) sty-rene; 2) hydroxystyrene; and 3) acid labile groups, particularly alkyl acrylate acid labile groups such as t-butylacrylate or t-butylmethacrylate). In general, resins having a variety of acid labile groups will be suitable, such as acid sensitive esters, carbonates, ethers, imides, etc. The photoacid labile groups will more typically be pendant from a polymer backbone, although resins that have acid labile groups that are integral to the polymer backbone also may be employed.

As discussed above, for imaging at sub-200 nm wavelengths such as 193 nm, preferably a photoresist is employed that contains one or more polymers that are substantially, essentially or completely free of phenyl or other aromatic groups. For example, for sub-200 nm imaging, preferred photoresist polymers contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

Suitable polymers that are substantially or completely free of aromatic groups and may be formulated with a PAG of the invention to provide a photoresist for sub-200 nm imaging are disclosed in European application EP930542A1 and U.S. Pat. Nos. 6,692,888 and 6,680,159, all of the Shipley Company.

Suitable polymers that are substantially or completely free of aromatic groups suitably contain acrylate units such as photoacid-labile acrylate units may be provided by polymerization of methyladamanatylacrylate, methyladamantyl-methacrylate, ethylfenchylacrylate, ethylfenchylmethacrylate, and the like; fused non-aromatic alicyclic groups such as may be provided by polymerization of a norbornene compound or other alicyclic compound having an endocyclic carbon-carbon double bond; an anhydride such as may be provided by polymerization of maleic anhydride and/or itaconic anhydride; and the like.

Preferred negative-acting compositions of the invention comprise one or more materials (such as a crosslinker component e.g. an amine-based materials such as a melamine resin) that will cure, crosslink or harden upon exposure to acid, and a photoactive component of the invention. Particularly preferred negative acting compositions comprise a resin binder such as a phenolic resin, a crosslinker component and a photoactive component of the invention. Such compositions and the use thereof has been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125.

For imaging at sub-200 nm wavelengths such as 193 nm, preferred negative-acting photoresists are disclosed in WO 03077029 to the Shipley Company.

Photoresists of the invention also may contain other materials. For example, other optional additives include actinic and contrast dyes, anti-striation agents, plasticizers, speed enhancers, sensitizers (e.g. for use of a PAG of the invention at longer wavelengths such as I-line (i.e. 365 nm) or G-line wavelengths), etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

A preferred optional additive of resists of the invention is an added base, e.g. a caprolactam, which can enhance resolution of a developed resist relief image. The added base is suitably used in relatively small amounts, e.g. about 1 to 10 percent by weight relative to the PAG, more typically 1 to about 5 weight percent. Other suitable basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, triphenylamine, aminophenol, 2-(4-aminophenyl)-2-(4-hydroxyphenyl)propane, etc.

The resin component of resists of the invention is typically used in an amount sufficient to render an exposed coating layer of the resist developable such as with an aqueous alkaline solution. More particularly, a resin binder will suitably comprise 50 to about 90 weight percent of total solids of the resist. The photoactive component should be present in an amount sufficient to enable generation of a latent image in a coating layer of the resist. More specifically, the photoactive component will suitably be present in an amount of from about 1 to 40 weight percent of total solids of a resist. Typically, lesser amounts of the photoactive component will be suitable for chemically amplified resists.

Photoresists for use in the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

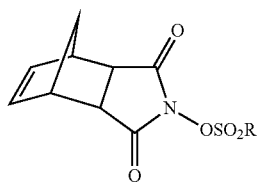

wherein R is camphor, adamantane, alkyl (e.g. $C_{1-12}$ alkyl) and fluoroalkyl such as fluoro($C_{1-18}$alkyl) e.g. $RCF_2$— where R is optionally substituted adamantyl.

Also preferred is a triphenyl sulfonium PAG, complexed with anions such as the sulfonate anions mentioned above, particularly a perfluoroalkyl sulfonate such as perfluorobutane sulfonate.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

Other suitable photoacid generators for use in present photoresists include for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, nitrobenzyl derivatives, for example, 2-nitrobenzyl p-toluenesulfonate, 2,6-dinitrobenzyl p-toluenesulfonate, and 2,4-dinitrobenzyl p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenensulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

A preferred optional additive of photoresist used in accordance with the invention is an added base, particularly tetramethylammonium hydroxide (TBAH), or tetramethylammonium lactate, which can enhance resolution of a developed resist relief image. For resists imaged at 193 nm, a preferred added base is a lactate salt of tetramethylammonium hydroxide as well as various other amines such as triisopropanol, diazabicyclo undecene or diazabicyclononene. The added base is suitably used in relatively small amounts, e.g. about 0.03 to 5 percent by weight relative to the total solids.

Photoresists used in accordance with the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The photoresists used in accordance with the invention are generally prepared following known procedures. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 percent by weight of the total weight of the photoresist composition. Blends of such solvents also are suitable.

Liquid photoresist compositions may be applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in accordance with the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed. Photoresists also may be suitably applied over an antireflective layer, particularly an organic antireflective layer.

Following coating of the photoresist onto a surface, it may be dried by heating to remove the solvent until preferably the photoresist coating is tack free.

The photoresist layer (with overcoated barrier composition layer, if present) in then exposed in a dry exposure lithography system, i.e. where the space between the exposure tool (particularly the projection lens) and the photoresist coated substrate is occupied by air other other non-liquid medium.

References herein to "dry exposure" or "dry exposing" or other similar term indicates that exposure is conducted with such as air or other non-liquid layer interposed between an exposure tool and the coated photoresist composition layer.

The photoresist composition layer is then suitably patterned exposed to activating radiation with the exposure energy typically ranging from about 1 to 100 mJ/cm², dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component (e.g. producing photoacid from the photoacid generator compound).

As discussed above, photoresist compositions are preferably photoactivated by a short exposure wavelength, particularly a sub-400 nm, sub-300 and sub-200 nm exposure wavelength, with I-line (365 nm), 248 nm and 193 nm being particularly preferred exposure wavelengths as well as EUV.

Following exposure, the film layer of the composition is preferably baked at temperatures ranging from about 70° C. to about 160° C. Thereafter, the film is developed, preferably by treatment with an aqueous based developer such as quaternary ammonium hydroxide solutions such as a tetraalkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention. All documents mentioned herein are incorporated by reference in their entirety.

General Comments to Examples:

In the following Examples, references to any of Monomers 1 through 29 includes the above-designated monomer structures in protected form (i.e. before the structure is shown post-treatment with alkaline developer).

In the following Examples, references to monomers of 2/233tMBA, 3,5-HFA and ECPMA designate the following structures:

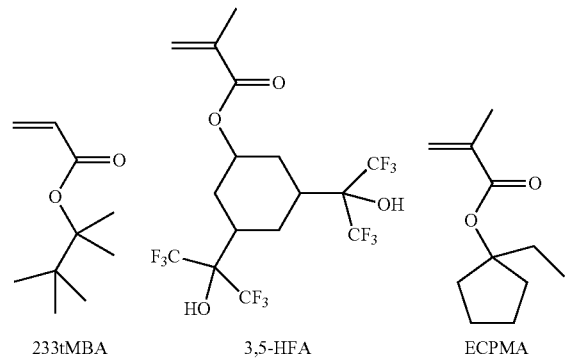

233tMBA      3,5-HFA      ECPMA

In the Table in Example 3 below, the water contact angles of θs—static contact angle; θr—receding angle; and θa—advancing angle. Those water contact angles are as defined and can be determined by procedures as disclosed in Burnett et al., *J. Vac. Sci. Techn. B*, 23(6), pages 2721-2727 (November/December 2005).

EXAMPLE 1

Synthesis of Resin Comprising Base Cleavable Groups

A. Monomer and initiator mixture: weigh 7.00 g of $(CH{=}CH(CH_3))C({=}O)O(CH_2)_2)O(C{=}O)CF_3$ (the first monomer) and 4.80 g of $(CH_2{=}CH)C({=}O)OC(CH(CH_3))_2C(CH_3)_3$ (the second monomer), 0.42 g of Trignox-23 (initiator) and 17.0 g PGMEA (solvent) into a feeding vial.

B. Reactor: 30 g of PGMEA in a reactor and maintain at 85° C.

C. Feed A into B: A is fed into B with a constant feeding rate in 120 minutes.

D. Holding temperature: after feeding A into B, the temperature of the reactor is maintained at 85° C. for additional two hrs, then allow the reactor temp to cool down naturally to room temperature.

This resin with base-reactive groups from the reactor can be used in a photoresist composition without further purification.

EXAMPLE 2

Syntheses of Additional Resins Comprising Base Cleavable Moieties (Type where Repeat Unit Comprises Multiple Base Reactive Moieties)

By procedures of Example 1, the following terpolymer and terapolymer are prepared where the polymerizable monomer units are specified below:

Base cleavable resin #1=35/55/10 GMA-DFAA/GMA-MDFA/233tMBA (35/55/10 refers to weight percent charging of the respective monomers in the polymer synthesis, i.e. this resin is prepared by polymerizing a monomer mixture that consists of 35 weight percent GMA-DFAA, 55 weight percent GMA-MDFA and 10 weight percent 233tMBA.

Base cleavable resin #2=15/20/55/10 GMA-2233TFPA-JGMA-DFAA/GMA-MDFA/233tMBA (this resin is prepared by polymerizing a monomer mixture that consists of 15 weight percent GMA-2233TFPA, 20 weight percent GMA-DFAA, 55 weight percent GMA-MDFA and 10 weight percent 233tMBA.

SLA-1: Poly Fox 656 (fluorodiol surfactant—available from Omnova Solutions Charleston, south Carolina)
Solvent: A=PGMEA, B=Cyclohexanone, C=Methyl 2-hydroxyisobutyrate
M1: 2-Methyladamantyl methacrylate
M2: alpha-gamma-butyrolacton methacrylate
M3: 5(or 6)-Cyanobicyclo[2.2.1]heptan-2-yl-methacrylate
M4: ethane-1,2-diylbis(oxy)ethane-1,1-diyl)bis(2-methylacrylate)
M5: 1-Ethylcyclopentyl methacrylate
M6: 2-Hydroxyladamantyl methacrylate
Base-reactive reasin (BRR)-1=25/69/6 GMA-PFPA/MTFE-MA/ECPMA

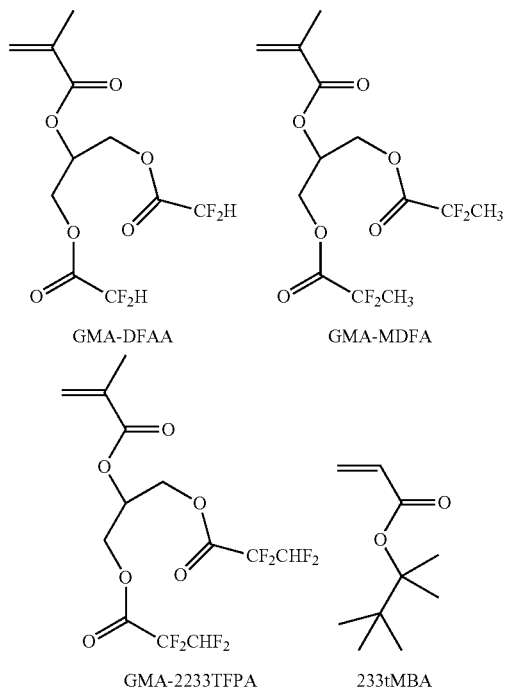

GMA-DFAA   GMA-MDFA

GMA-2233TFPA   233tMBA

ECPMA   MTFE   GMA-PFPA

EXAMPLE 3

Photoresist Preparation and Evaluation

Part 1: Photoresist Preparation
Three photoresist compositions (specified as Resist A, Resist B and Resist C below) were prepared by admixing the materials specified below including in Table 1. All amounts are weight percents.

TABLE 1

| | Polymer | PAG | Quencher | SLA/EBL* | Solvent |
|---|---|---|---|---|---|
| Resist-A | Poly- | PAG- | Q-1 | SLA-1 (0.15%) | A/B/C = 7/1/2 |
| Resist-B | 1/-2 | 1/-2 | | BRR-A (1%) | A/B/C = 7/1/2 |
| Resist-C | (50/50) | (97/3) | | BRR-A (2%) | A/B = 7/3 |

*Loading based on total solid

Poly-1: M1/M2/M3/M4=34/34/23/9
Poly-2: M5/M2/M6=35/40/25
PAG-1: 4-tert-butylphenyldiphenylsulfonium perfluorobutanesulfonate
PAG-2: triphenylsulfonium triflate
Q-1: triisopropanolamine Part 2 Defect Evaluation:
Resists A, B and C as specified in Part 1 above were coated onto separate silicon wafers that had a first layer of an organic antireflective composition, and prebaked at 110° C. for 60 seconds. Dry exposure was carried out with ASML 1100 193 nm scanner (NA=0.75). Checkerboard defect mask was used to create exposed and unexposed areas, and sizing energy to print 75 nm 1:1 line and space pattern (26 mJ) was used for exposure. After exposure, films were baked at 110° C. for 60 seconds, and developed with 2.38 wt % aqueous tetramethyl ammonium hydroxide developer. Defect count was measured by KLA 2351 defect inspection tool with results set forth in the following Table 2.

TABLE 2

| Test | SLA or BRR | Bulk Unexposed DD (/cm$^2$) | Bulk Exposed DD (/cm$^2$) |
|---|---|---|---|
| Resist-A | SLA (0.15 wt %) | 299, 239 | 275, 255 |
| Resist-B | BRR-A (1 wt %) | 0.06, 0.02 | 2.4, 0.5 |
| Resist-C | BRR-A (2 wt %) | 0.02, 0.05 | 0.8, 0.3 |

Repeat of two wafers

EXAMPLE 4

Photoresist Preparation and Processing

A photoresist composition is prepared by admixing the following materials in the specified amounts:
1. Resin component: Terpolymer of (2-methyl-2-adamantyl methacrylate/beta-hydroxy-gamma-butyrolactone methacrylate/cyano-norbornyl methacrylate in an amount of 6.79 weight % based on total weight of the photoresist composition;

2. Photoacid generator compound: T-butyl phenyl tetramethylene sulfonium perfluorobutanesulfonate in an amount of 0.284 weight % based on total weight of the photoresist composition;
3. Base additive: N-Alkyl Caprolactam in an amount of 0.017 weight % based on total weight of the photoresist composition;
4. Substantially non-mixable additive (i.e. base-reactive resin): Polymer of Example 1 prepared as described in Example 1 above and in an amount of 0.213 weight % based on total weight of the photoresist composition.
5. Solvent component: propylene glycol monomethyl ether acetate to provide about a 90 percent fluid composition.

This photoresist composition containing is spin-coated onto silicon wafers, dried on hotplate to remove solvent and then exposed in a dry lithography process with aqueous immersion fluid directly contacting the dried photoresist layers. In that process, the photoresist layers is exposed to patterned 193 nm radiation at a dose of 24.1 mJ/cm$^2$.

The photoresist layers is then post-exposed baked (such as at about 120° C.) and developed with 0.26N alkaline aqueous developer solution.

EXAMPLE 4

Polymer Testing

Polymers with the aforementioned monomers having base-reactive groups have demonstrated to have good developer switch-ability thereby provided desired hydrophilicity to the resist surface that is enriched with the polymer. Set forth in Table 3 below are of examples of contact angles of thus enriched-resist surfaces before and after being exposed to developer. Tests were conducted for 3% loading relative of the substantially non-mixable polymer to the total solid of a resist which has a total solid content of 4.4% and for 60 second single puddle development time with 0.26N tetramethylammonium hydroxide developer composition.

TABLE 3

| Polymer composition | Contact Angle as coated with soft bake | | | | Contact Angle after develop/ DI water rinse | | | |
|---|---|---|---|---|---|---|---|---|
| | Θs | Θr | Θa | Θt | Θs | Θr | Θa | Θt |
| Homopolymer of monomer-2 | 90° | 64° | 90° | 33° | 47° | 24° | 67° | 36° |
| Homopolymer of monomer-22 | 78° | 67° | 80° | 22° | 55° | 45° | 78° | 31° |
| Homopolymer of monomer-19 | 90° | 67° | 89° | 29° | 52° | 25° | 75° | 43° |
| Homopolymer of monomer-20 | 96° | 77° | 106° | 34° | 51° | 27° | 73° | 42° |
| 75/15/10 Monomer-2/233tMBA/ 3,5-HFA | 90° | 69° | 93° | 31° | 64° | 30° | 83° | 55° |
| 75/15/10 Monomer-2/233tMBA/MA-EATf | 89° | 66° | 93° | 34° | 57° | 29° | 73° | 48° |
| 94/6 Monomer 7/ECPMA | 89° | 68° | 91° | 26° | 45° | 19° | 67° | 43° |
| 94/6 Monomer 8/ECPMA | 93° | 81° | 98° | 21° | 58° | 23° | 69° | 37° |

Θs—static contact angle
Θr—receding angle
Θa—advancing angle

EXAMPLE 5

Additional Polymer Testing

Base reactive resin #1 was loaded at 3 weight percent of total solids (all components except solvent carrier) of a photoresist composition of the type specified in Example 4 (Base reactive resin #1 was substituted for the substantially non-mixable additive of Example 3). Set forth in the following Table 4 below are contact angles of this photoresist surfaces before and after being treated to 0.26N tetramethylammonium hydroxide developer composition.

TABLE 4

| Static and Dynamic Contact Angle | | | | Post Develop Contact Angle, 20 sec/60 sec | | | |
|---|---|---|---|---|---|---|---|
| Θs | Θr | Θa | Θt | Θs | Θr | Θa | Θt |
| 82.9 | 69.5 | 84.8 | 17.2 | 60.5/62.3 | 13.4/15.4 | 70.4/69.8 | 39.8/40.4 |

Θs—static contact angle
Θr—receding angle
Θa—advancing angle

EXAMPLE 6

Additional Polymer Testing

Base reactive resin #2 as prepared as described in Example 2 above was loaded at 3 weight percent of total solids (all components except solvent carrier) of a photoresist composition of the type specified in Example 4 (Base reactive resin #2 was substituted for the substantially non-mixable additive of Example 4). Set forth in the following Table 5 below are contact angles of this photoresist surfaces before and after being treated to 0.26N tetramethylammonium hydroxide developer composition.

TABLE 5

| Static and Dynamic Contact Angle | | | | Post Develop Contact Angle, 20 sec/60 sec | | | |
|---|---|---|---|---|---|---|---|
| Θs | Θr | Θa | Θt | Θs | Θr | Θa | Θt |
| 85.5 | 71.8 | 86.2 | 18 | 46.9/48.1 | 13.8/16.8 | 68.5/68.7 | 47.6/50.5 |

Θs—static contact angle
Θr—receding angle
Θa—advancing angle

What is claimed is:

1. A method for processing a photoresist composition, comprising:
 (a) applying on a substrate a photoresist composition comprising:
  (i) one or more resins,
  (ii) a photoactive component, and
  (iii) one or more materials that comprise base-reactive groups, the one or more materials distinct from the one or more resins; and
 (b) dry exposing the applied photoresist layer to radiation activating for the photoresist composition;
 wherein said (iii) one or more materials comprise a resin that comprises a repeat unit provided by at least one monomer represent by the following Formula (I), (II) or (III):

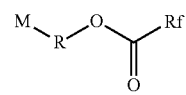
(I)

where in Formula (I) M is a polymerizable functional group, R is an alkyl spacer group with or without carboxyl linkages, Rf is a fluoro or perfluoro alkyl group with at least the alpha carbon being fluorinated;

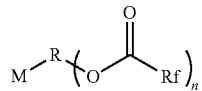   II wherein in Formula (II) M is a polymerizable functional group, R is C1-20 linear or branched alkyl spacer group with or without carboxyl linkages, Rf is a fluoro or perfluoro alkyl group with at least the alpha carbon being fluorinated, and n is an integer equal to or greater than 2;

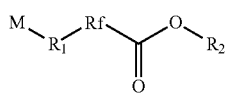   III wherein in Formula (III) M is a polymerizable functional group R1 is an alkyl spacer with or without carboxyl linkages, Rf is a fluoro or perfluoro alkylene group with at least the alpha carbon being fluorinated, and R2 is an alkyl group.

2. The method of claim 1 wherein the one or more materials migrate toward upper portions of the photoresist composition layer during the applying.

3. The method of claim 1 wherein the (iii) one or more materials have a lower surface energy than the (i) one or more resins.

4. The method of claim 1 wherein the one or more materials comprises photoacid-labile groups.

5. The method of claim 1 further comprising developing the exposed photoresist layer with aqueous alkaline developer whereby the one or more base-reactive groups undergo a bond-breaking reaction to provide one or more polar groups.

6. The method of claim 5 wherein the photoresist layer after development has a water contact receding angle of less than 30°, and/or the photoresist layer prior to development has a water contact receding angle of in excess of 40°.

7. The method of claim 1 wherein the (iii) one or more materials comprise a repeat unit provided by at least one monomer of Formula (I).

8. The method of claim 1 wherein the (iii) ore or more materials comprise a repeat unit provided by at least one monomer of Formula (II).

9. The method of claim 1 wherein the (iii) one or more materials comprise a repeat unit provided by at least one monomer of Formula (III).

* * * * *